(12) United States Patent
Min et al.

(10) Patent No.: US 7,675,374 B2
(45) Date of Patent: Mar. 9, 2010

(54) VOLTAGE CONTROLLED OSCILLATOR WITH SWITCHING BIAS

(75) Inventors: Byung Hun Min, Jeollabuk-do (KR); Young Ho Kim, Daejeon (KR); Byoung Gun Choi, Daegu (KR); Seok Bong Hyun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/111,555

(22) Filed: Apr. 29, 2008

(65) Prior Publication Data
US 2008/0266006 A1 Oct. 30, 2008

(30) Foreign Application Priority Data
Apr. 30, 2007 (KR) ............ 10-2007-0042003

(51) Int. Cl.
*H03L 5/00* (2006.01)
(52) U.S. Cl. ................................. 331/109; 331/183
(58) Field of Classification Search ............. 331/109, 331/183, 167, 117 FE, 117 R
See application file for complete search history.

(56) References Cited

U.S. PATENT DOCUMENTS 6,456,120 B1 * 9/2002 Huang ......................... 326/115
6,812,802 B1 * 11/2004 Godambe et al. ........... 331/183
6,909,336 B1 * 6/2005 Rajagopalan et al. ....... 331/183
2003/0025566 A1 * 2/2003 Rogers ........................ 331/109
2006/0077012 A1 4/2006 Shi et al.

FOREIGN PATENT DOCUMENTS

| JP | 2001-237640 | 8/2001 |
|---|---|---|
| KR | 10-2003-0053791 A | 7/2003 |
| KR | 10-2005-0087328 A | 8/2005 |
| KR | 10-2007-0008739 A | 1/2007 |

OTHER PUBLICATIONS

Hegazi et al., "A filtering technique to lower LC oscillator phase noise", IEEE Journal of Solid-State Circuits, vol. 36, No. 12, Dec. 2001, pp. 1921-1930.
Kassim et al., "Tail current flicker noise reduction in LC VCOs by complementary switched biasing", Proceedings of the 15th International Conference on Microelectronics, Dec. 9-11, 2003 pp. 102-105.

* cited by examiner

*Primary Examiner*—Joseph Chang
(74) *Attorney, Agent, or Firm*—Rabin & Berdo, PC (57) ABSTRACT

Provided is a voltage controlled oscillator to which a switching bias technique is applied so as to lower flicker noise of a bias circuit and enhance phase noise characteristics, thereby reducing the overall chip area to make it possible to achieve integration. A common mode voltage applied to the bias circuit is negatively fed back to an oscillation waveform. Therefore, it is possible to stabilize the magnitude of the oscillation waveform of the voltage controlled oscillator with respect to a change in an external condition.

14 Claims, 7 Drawing Sheets

VOLTAGE CONTROLLED OSCILLATOR WITH SWITCHING BIAS

CROSS-REFERENCE TO RELATED APPLICATION

This application claims priority to and the benefit of Korean Patent Application No. 2007-0042003, filed Apr. 30, 2007, the disclosure of which is incorporated herein by reference in its entirety.

BACKGROUND

1. Field of the Invention

The present invention relates to a voltage controlled oscillator with a switching bias, and more specifically, to a voltage controlled oscillator to which a switching bias technique is applied so as to enhance phase noise characteristics and stabilize the magnitude of an oscillation waveform.

The present invention is derived from a project entitled "Development of Digital RF and ADC Chips for Multi-Mode SDR Terminal [2006-S-015-01]" conducted as an IT R&D program for the Ministry of Information and Communication (Republic of Korea).

2. Discussion of Related Art

In general, a voltage controlled oscillator means an oscillator which changes the capacitance of a variable capacitor through voltage adjustment, thereby adjusting a frequency. Such a voltage controlled oscillator is an essential part of all electric communication systems and may be used when a frequency of a predetermined signal is up-converted or down-converted.

Figure 1:
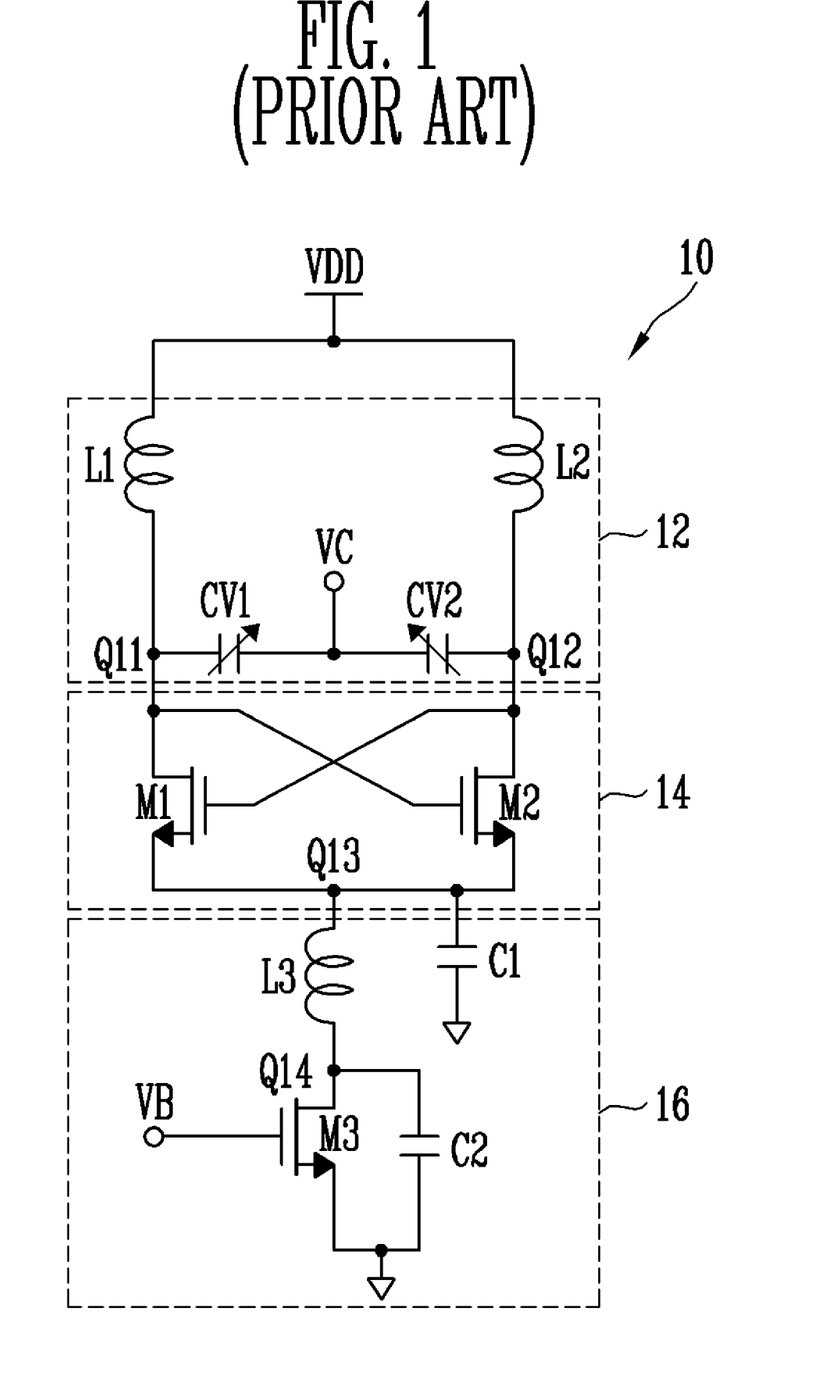
FIG. 1 is a circuit diagram of a conventional voltage controlled oscillator.

FIG. 1 is a circuit diagram of a conventional voltage controlled oscillator, and specifically, a voltage controlled oscillator for preventing flicker noise of a bias circuit.

As shown in FIG. 1, the voltage controlled oscillator 10 includes an LC resonance circuit 12, a loss compensation circuit 14 for compensating for a loss, and a bias circuit 16 for supplying a bias current. The connection relationship between the respective circuits will be briefly described as follows.

First and second inductors L1 and L2 are respectively connected between a power supply terminal VDD, and a first node Q11 and a second node Q12. A first varactor CV1 is connected between a voltage control terminal VC and the first node Q11, and a second varactor CV2 is connected between the voltage control terminal VC and the second node Q12. Drain, gate, and source terminals of a first NMOS transistor M1 are connected to the first node Q11, the second node Q12 and a third node Q13, respectively. Drain, gate, and source terminals of a second NMOS transistor M2 are connected to the second node Q12, the first node Q11 and the third node Q13, respectively. A third inductor L3 is connected between the third node Q13 and a fourth node Q14 and a first capacitor C1 is connected between the third node Q13 and a ground terminal GND. Drain, gate, and source terminals of a third NMOS transistor M3 are connected to the fourth node Q14, a bias voltage terminal VB, and the ground terminal GND, respectively. A second capacitor C2 is connected between the fourth node Q14 and the ground terminal GND.

In the voltage controlled oscillator 10 configured in such a manner, when flicker noise of the bias circuit 16 is up-converted into an oscillation waveform, phase noise characteristics may be reduced.

To solve such a problem, a method has been disclosed in which the third inductor L3 and the first capacitor C1 are connected in parallel to each other between the loss compensation circuit 14 and the bias circuit 16, and are caused to resonate at two times greater oscillation frequency such that the third node Q13 has a high impedance value at two times greater oscillation frequency. Then, the flicker noise generated from the bias circuit 16 has a small effect on the oscillation node.

This is implemented through the result of research in which, when a parallel LC resonance circuit was provided between a loss compensation circuit and a bias circuit such that the resonance frequency thereof became two times larger than an oscillation frequency, it was possible to lower flicker noise of the bias circuit which had an effect on an oscillation waveform. The result of the research is disclosed in "A Filtering Technique to Lower LC Oscillator Phase Noise" (IEEE Journal of Solid-State Circuits, December, 2001) by Emad Hegazi.

In the above-described voltage controlled oscillator 10, however, the inductor L3 with a large volume should be used. Therefore, when an integrated circuit is designed, a chip area inevitably increases. Further, other frequency components, excluding a two times greater frequency than the oscillation frequency, are not suppressed at the third node Q13.

Further, since the magnitude of the oscillation waveform significantly changes with respect to changes in external conditions, such as frequency tuning, a process change, a temperature change, and so on, the operation of the voltage controlled oscillator is unstabilized.

SUMMARY OF THE INVENTION

The present invention is directed to a voltage controlled oscillator to which a switching bias technique is applied so as to lower flicker noise of a bias circuit and enhance phase noise characteristics, thereby reducing the overall chip area and making it possible to achieve integration.

The present invention is also directed to a voltage controlled oscillator, in which a common mode voltage applied to a bias circuit is negatively fed back to an oscillation waveform to stabilize the magnitude of the oscillation waveform of the voltage controlled oscillator with respect to a change in an external condition.

One aspect of the present invention provides a voltage controlled oscillator with a switching bias including: an LC resonance circuit which oscillates a resonance frequency depending on an input voltage; a loss compensation circuit composed of first and second transistors which amplify the oscillated resonance frequency; a bias circuit composed of third and fourth transistors for providing a bias current to the first and second transistors; and a peak detector which detects a peak value from an oscillation waveform of the LC resonance circuit and then applies the detected peak value to the third and fourth transistors of the bias circuit, the peak detector being composed of fifth and sixth transistors and third and fourth capacitors.

Another aspect of the present invention provides a voltage controlled oscillator with a switching bias including: an LC resonance circuit which oscillates a resonance frequency depending on an input voltage; a loss compensation circuit composed of first and second transistors which amplify the oscillated resonance frequency; a bias circuit composed of third and fourth transistors for providing a bias current to the first and second transistors; and a switching circuit which turns on/off the third and fourth transistors of the bias circuit depending on the oscillation waveform of the LC resonance circuit.

Still another aspect of the present invention provides a voltage controlled oscillator with a switching bias including:

an LC resonance circuit which oscillates a resonance frequency depending on an input voltage; a loss compensation circuit composed of first and second transistors which amplify the oscillated resonance frequency; a bias circuit composed of third and fourth transistors for providing a bias current to the first and second transistors; a peak detector which detects a peak value from an oscillation waveform of the LC resonance circuit and then applies the detected peak value to the third and fourth transistors of the bias circuit, the peak detector being composed of fifth and sixth transistors and third and fourth capacitors; and a switching circuit which turns on/off the third and fourth transistors of the bias circuit depending on the oscillation waveform of the LC resonance circuit.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Before the present invention is described, a research result will be briefly described. In the research, when a switching bias technique was used instead of applying a constant voltage to the gate terminal of a MOS transistor through which a bias current was flowed, flicker noise was lowered by 5-7 dB. The result of the research is disclosed in "MOSFET 1/f Noise Measurement under Switched Bias Conditions" (IEEE Electron Device Letters, January, 2000) by A. P. van der Wel.

In the present invention, the switching bias technique is applied to a voltage controlled oscillator in accordance with the result of the above research. That is, an oscillation waveform of the voltage controlled oscillator is used for switching a bias circuit. Then, phase noise characteristics are enhanced, and the magnitude of the oscillation waveform is stabilized. Hereinafter, exemplary embodiments of the present invention will be described in detail with reference to the accompanying drawings.

Figure 2A:
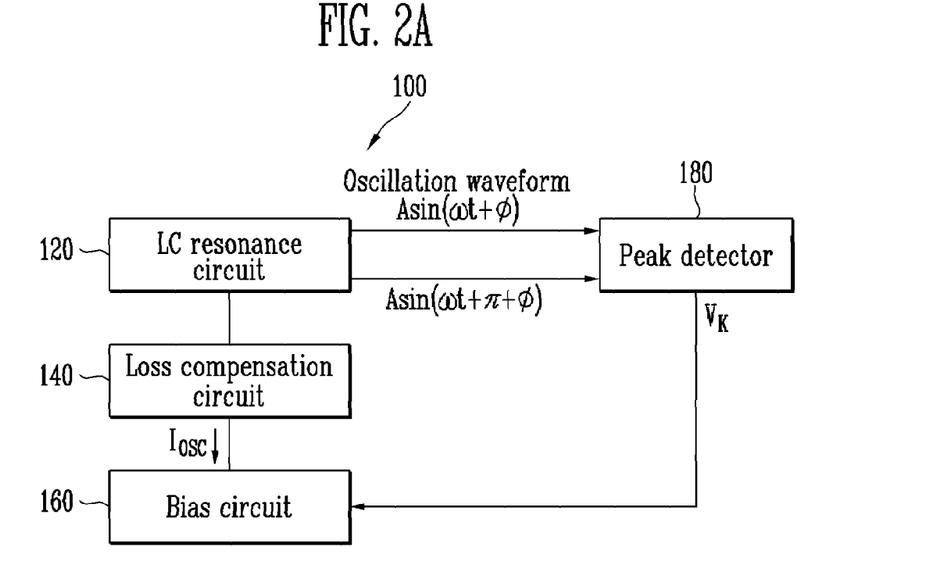
FIGS. 2A and 2B are a block diagram and a circuit diagram of a voltage controlled oscillator according to a first exemplary embodiment of the present invention, respectively.
Figure 2B:
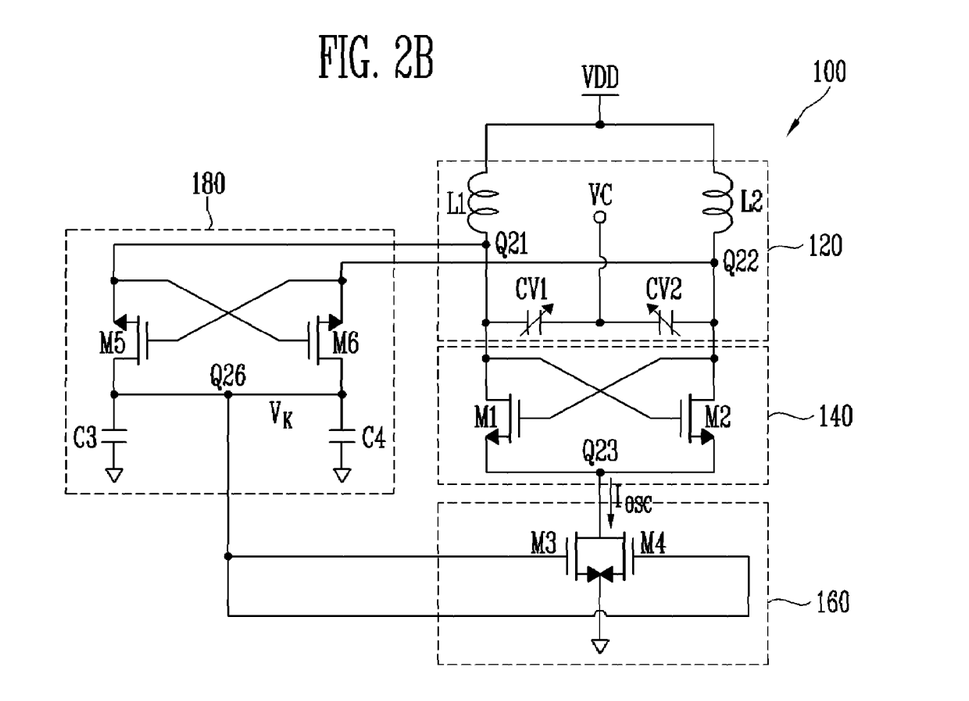

FIGS. 2A and 2B are a block diagram and a circuit diagram of a voltage controlled oscillator according to a first exemplary embodiment of the present invention.

As shown in FIGS. 2A and 2B, the voltage controlled oscillator 100 according to the first exemplary embodiment of the present invention includes an LC resonance circuit 120 which oscillates a resonant frequency depending on an input voltage, a loss compensation circuit 140 which amplifies the resonant frequency oscillated from the LC resonance circuit 120 so as to compensate for a loss, a bias circuit 160 which provides a bias current to the loss compensation circuit 140, and a peak detector 180 which detects a peak value from an oscillation waveform of the LC resonance circuit 120 and then applies the detected peak value to the bias circuit 160.

The LC resonance circuit 120 includes a first inductor L1, a second inductor L2, a first varactor CV1, and a second varactor CV2. The loss compensation circuit 140 includes a first NMOS transistor M1 and a second NMOS transistor M2.

The bias circuit 160 includes a third NMOS transistor M3 and a fourth NMOS transistor M4, and the peak detector 180 includes a fifth NMOS transistor M5, a sixth NMOS transistor M6, a third capacitor C3, and a fourth capacitor C4.

The connection relationship between the respective circuits will be described in detail.

The first and second inductors L1 and L2 are respectively connected between a power supply terminal VDD, and a first node Q21 and a second node Q22. The first and second varactors CV1 and CV2 are respectively connected between a voltage control terminal VC, and the first node Q21 and the second node Q22. Here, the first and second nodes Q21 and Q22 mean oscillation nodes which are connected to one end and the other end of the LC resonance circuit 120.

Drain, gate, and source terminals of the first NMOS transistor M1 are connected to the first node Q21, the second node Q22, and a third node Q23, respectively. Drain, gate, and source terminals of the second NMOS transistor M2 are connected to the second node Q22, the first node 21, and the third node Q23, respectively. Here, the third node Q23 means a common node of the first and second NMOS transistors M1 and M2.

Drain, gate, and source terminals of the third NMOS transistor M3 are connected to the third node Q23, a sixth node Q26, and a ground terminal GND, respectively. Drain, gate, and source terminals of the fourth NMOS transistor M4 are connected to the third node Q23, the sixth node Q26, and the ground terminal GND, respectively. Here, the sixth node Q26 means a common node of the fifth and sixth transistors M5 and M6.

Source, gate, and drain terminals of the fifth NMOS transistor M5 are connected to the first node Q21, the second node Q22, and the sixth node Q26, respectively. Gate, source, and drain terminals of the sixth NMOS transistor M6 are connected to the first node Q21, the second node Q22, and the sixth node Q26, respectively. The third and fourth capacitors C3 and C4 are connected between the sixth node Q26 and the ground terminal GND, respectively.

The peak detector 180 detects a peak value $V_K$ from the oscillation waveforms of the oscillation nodes Q21 and Q22 and then applies the detected peak value $V_K$ to the bias circuit 160.

Here, two differential output waveforms of the LC resonance circuit 120 have the same magnitude and a phase difference of π in radian. Therefore, when the differential output waveforms are set to A sin(ωt+φ) and A sin(ωt+π+φ), respectively, and a DC value of the peak detector 180 and a current value of the bias circuit 160 are represented by $V_K$ and $I_{OSC}$, respectively, the magnitude A of the oscillation waveform is proportional to the bias current $I_{OSC}$. That is, as the bias current $I_{OSC}$ increases, the magnitude A of the oscillation waveform also increases, and as the bias current $I_{OSC}$ decreases, the magnitude A of the oscillation waveform also decreases.

Further, when the magnitude A of the oscillation waveform increases, a positive peak value of the peak detector 180 increases and a negative peak value thereof decreases.

Figure 3A:
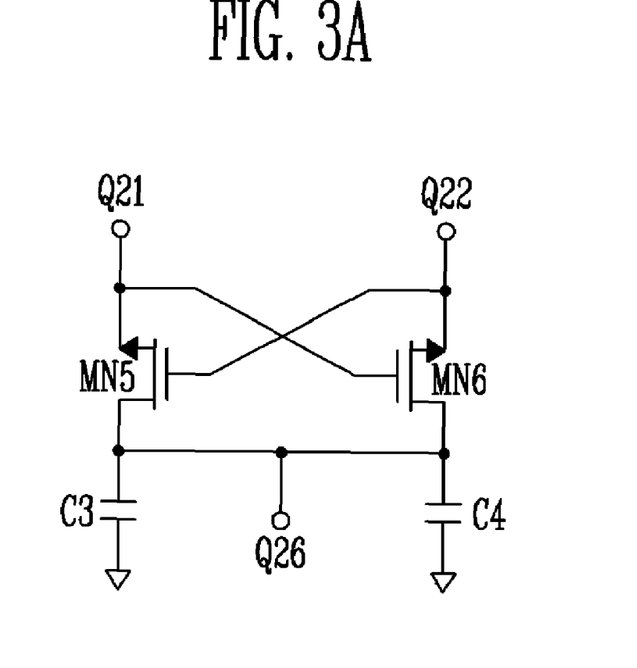
FIGS. 3A and 3B are circuit diagrams of a negative peak detector and a positive peak detector, respectively.

That is, when the bias circuit 160 is composed of NMOS transistors, the peak detector 180 should be composed of a negative peak detector which can detect a negative peak value. Referring to FIG. 3A, the negative peak detector will be described in more detail below.

FIG. 3A is a circuit diagram of the negative peak detector.

Referring to FIG. 3A, in the negative peak detector, the source, gate, and drain terminals of the fifth NMOS transistor MN5 are respectively connected to the first node Q21, the second node Q22, and the sixth node Q26. The gate, source, and drain terminals of the sixth NMOS transistors MN6 are respectively connected to the first node Q21, the second node Q22, and the sixth node Q26. The third and fourth capacitors C3 and C4 are respectively connected between the sixth node Q26 and the ground terminal GND.

In the negative peak detector configured in such a manner, the first and second nodes Q21 and Q22 are respectively connected to the oscillation nodes Q21 and Q22 of the LC resonance circuit 120 which differentially operate. Whenever a potential difference between the two differential output nodes is generated, the fifth and sixth NMOS transistors MN5 and MN6 are complementarily turned on/off so as to charge the third and fourth capacitors C3 and C4 with a negative peak value of the oscillation waveform.

Referring again to FIG. 2B, when the bias current $I_{OSC}$ increases so that the magnitude of the oscillation waveform increases, the negative peak value of the oscillation waveform detected by the negative peak detector decreases. Further, as the negative peak value is applied as a common mode voltage of the bias circuit 160, the bias current $I_{OSC}$ decreases again. As a result, the magnitude of the oscillation waveform decreases.

That is, as the peak value of the oscillation waveform detected by the peak detector 180 is negatively fed back to the oscillation waveform, the magnitude of the oscillation waveform can be stabilized.

Meanwhile, when the bias circuit 160 is composed of PMOS transistors, and if the magnitude A of the oscillation waveform increases, the negative peak value of the peak detector 180 increases, and the positive peak value thereof decreases. Accordingly, the peak detector 180 should be composed of a positive peak detector which can detect a positive peak value. The positive peak detector will be described in more detail below with reference to FIG. 3B.

Figure 3B:
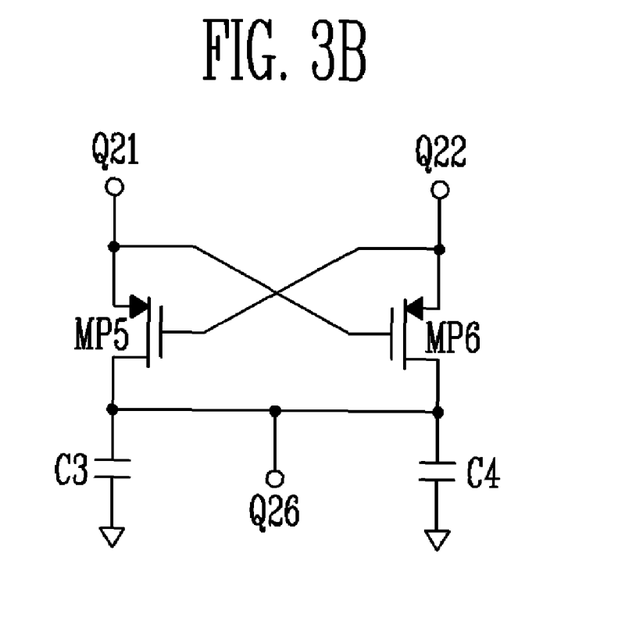

FIG. 3B is a circuit diagram of the positive peak detector.

Referring to FIG. 3B, in the positive peak detector, the source, gate, and drain terminals of the fifth PMOS transistor MP5 are respectively connected to the first node Q21, the second node Q22, and the sixth node Q26, and the gate, source and drain terminals of the sixth PMOS transistor MP6 are respectively connected to the first node Q21, the second node Q22, and the sixth node Q26. The third and fourth capacitors C3 and C4 are respectively connected between the sixth node Q26 and the ground terminals GND.

In the positive peak detector configured in such a manner, the first and second nodes Q21 and Q22 are respectively connected to the oscillation nodes Q21 and Q22 of the LC resonance circuit 120 which differentially operate. Whenever a potential difference between the two differential output nodes is generated, the fifth and sixth PMOS transistors MP5 and MP6 are complementarily turned on/off so as to charge the third and fourth capacitors C3 and C4 with a positive peak value of the oscillation waveform.

That is, when the bias current $I_{OSC}$ increases so that the magnitude of the oscillation waveform increases, the positive peak value detected by the positive peak detector 180 decreases, and as the positive peak value is applied to the bias circuit 160, the bias current $I_{OSC}$ decreases again. As a result, the magnitude of the oscillation waveform decreases.

As the peak value of the oscillation waveform detected by the peak detector 180 is applied as a common mode voltage of the bias circuit 160, the peak value of the oscillation waveform is negatively fed back to the oscillation waveform. Accordingly, when the magnitude A of the oscillation waveform is controlled by a proportional relationship between the bias current value $I_{OSC}$ and the magnitude A of the oscillation waveform such that the oscillation reaches a normal state, the magnitude A of the oscillation waveform can be stabilized.

Figure 4A:
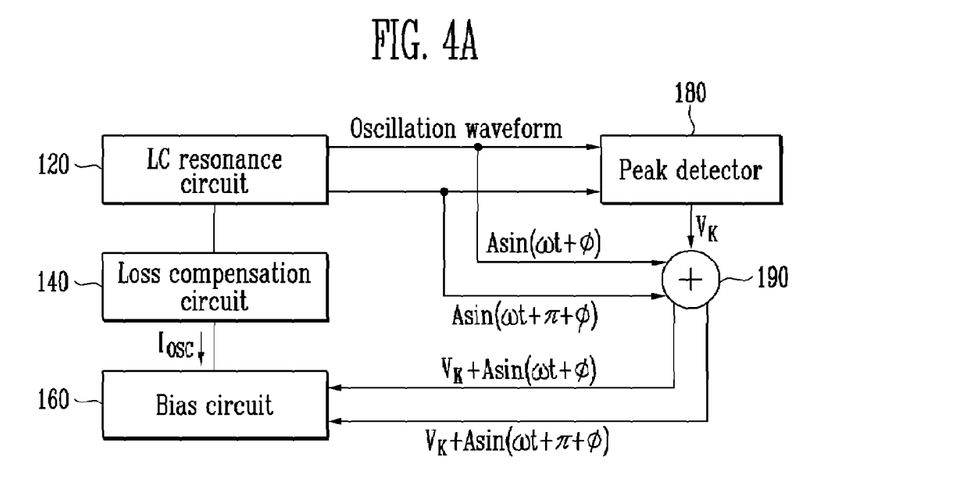
FIGS. 4A and 4B are a block diagram and a circuit diagram of a voltage controlled oscillator according to a second exemplary embodiment of the present invention, respectively.
Figure 4B:
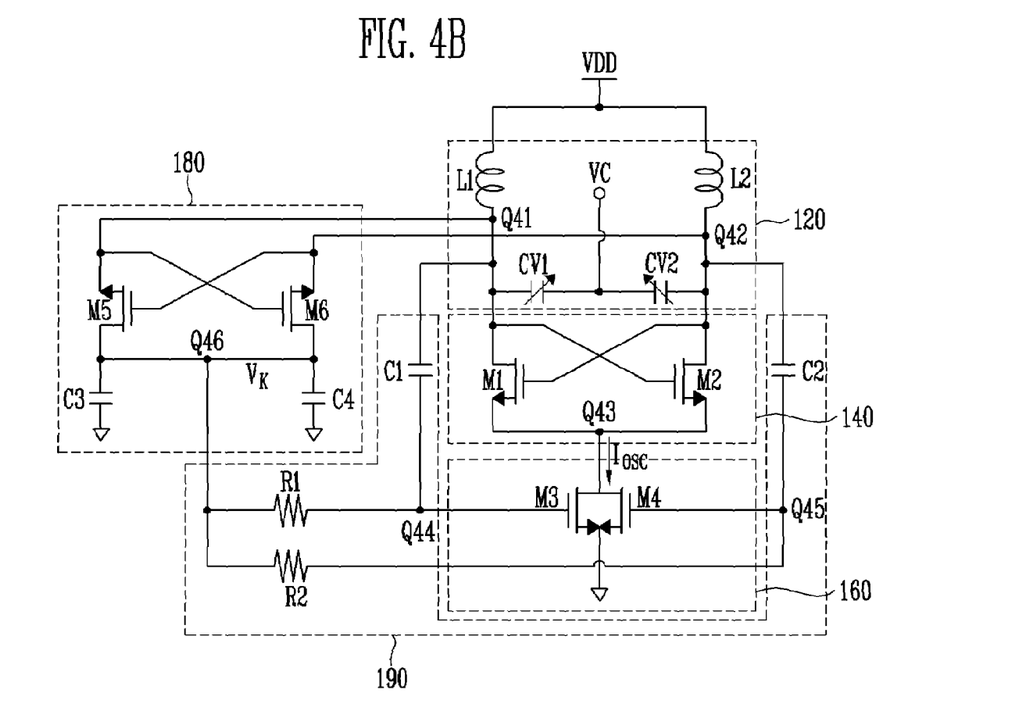

FIGS. 4A and 4B are a block diagram and a circuit diagram of a voltage controlled oscillator according to a second exemplary embodiment of the present invention.

The voltage controlled oscillator according to the second exemplary embodiment of the present invention has a structure in which a switching circuit 190 is added to the structure shown in FIGS. 2A and 2B such that the switching bias technique is applied. In the voltage controlled oscillator, first and second resistors R1 and R2 are connected to an output of the peak detector 180, and first and second capacitors C1 and C2 are connected to oscillation nodes Q41 and Q42, respectively, thereby constructing the switching circuit 190.

Here, output values of the switching circuit 190 are $V_K + A \sin(\omega t+\phi)$ and $V_K + A \sin(\omega t+\pi+\phi)$, respectively. The output values are applied to the bias circuit 160 so as to turn on/off the transistors of the bias circuit 160.

Accordingly, flicker noise of the MOS transistor used in the bias circuit 160 is lowered, so that phase noise characteristics of the voltage controlled oscillator 100 are enhanced. This will be described in more detail below.

The oscillation waveforms of the oscillation nodes Q41 and Q42 are applied to the bias circuit 160 through the first and second capacitors C1 and C2 so as to turn on/off the third and fourth NMOS transistors M3 and M4. When the third NMOS transistor M3 is turned on during a half period of the oscillation waveform, the fourth NMOS transistor M4 is turned off. Further, when the third NMOS transistor M3 is turned off during a half period of the oscillation waveform, the fourth NMOS transistor M4 is turned on.

That is, the flicker noise of the bias circuit 160 is lowered through the switching operation of the third and fourth transistors M3 and M4 so that the phase noise characteristics are enhanced.

When the magnitude of the oscillation waveforms at the oscillation nodes Q41 and Q42 increases, the potential of an output node Q46 of the peak detector 180 decreases. Accordingly, the common mode potential of the gate terminals of the third and fourth transistors M3 and M4 composing the 20 bias circuit 160 also decreases. As a result, the current flowing through the LC resonance circuit 120 decreases, so that the oscillation waveform decreases.

That is, when the magnitude of the oscillation waveform is controlled by the negative feedback structure such that the oscillation reaches a normal state, the magnitude of the oscillation waveform is stabilized.

Meanwhile, the bias circuit 160 may be differentially configured for a smooth oscillation operation of the LC resonance circuit 120. This will be described in more detail below.

Figure 5:
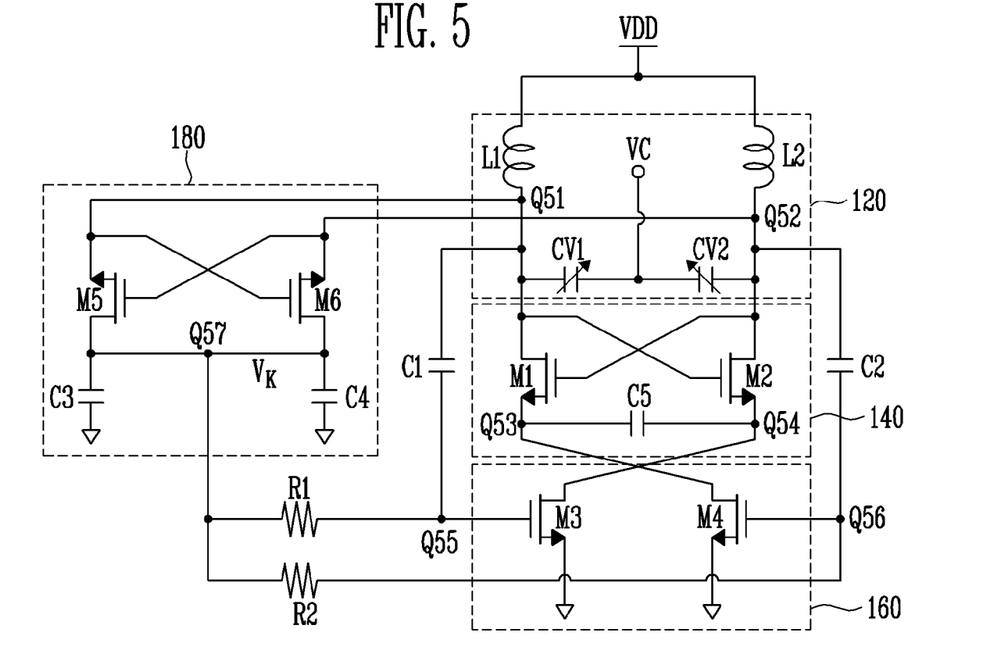
FIG. 5 is a circuit diagram of a voltage controlled oscillator according to a third exemplary embodiment of the present invention.

FIG. 5 is a circuit diagram of a voltage controlled oscillator according to a third exemplary embodiment of the present invention.

First and second inductors L1 and L2 are respectively connected between a power supply terminal VDD, and a first node Q51 and a second node Q52. First and second varactors CV1 and CV2 are respectively connected between a voltage control terminal VC, and the first node Q51 and the second node Q52. The drain, gate and source terminals of a first NMOS transistor M1 are respectively connected to the first node Q51, the second node Q52, and a third node Q53. The drain, gate and source terminals of a second NMOS transistor M2 are respectively connected to the second node Q52, the first node Q51, and a fourth node Q54. The drain, gate and source terminals of the third NMOS transistor M3 are respectively connected to the fourth node Q54, a fifth node Q55, and a ground terminal GND. The drain, gate and source terminals of a fourth NMOS transistor M4 are respectively connected to the third node Q53, a sixth node Q56, and the ground terminal GND. The source, gate and drain terminals of the fifth NMOS transistor M5 are respectively connected to the first node Q51, the second node Q52, and a seventh node Q57. The source, gate and drain terminals of a sixth NMOS transistor M6 are respectively connected to the second node Q52, the first node Q51, and the seventh node Q57. A first capacitor C1 is connected between the first node Q51 and the fifth node Q55, and a second capacitor C2 is connected between the second node Q52 and the sixth node Q56. Third and fourth capacitors C3 and C4 are respectively connected between the seventh node Q57 and the ground terminal GND. First and second resistors R1 and R2 are respectively connected between the seventh node Q57, and the fifth node Q55 and the sixth node Q56. A fifth capacitor C5 is connected between the third node Q53 and the fourth node Q54. Here, the fifth capacitor C5 is used to increase negative resistance which compensates for a loss.

In the voltage controlled oscillator configured in such a manner, the drain terminals of the third NMOS transistor M3 and the fourth NMOS transistor M4 are connected to the source terminals of the second NMOS transistor M2 and the first NMOS transistor M1 so that the bias circuit 160 differentially operates.

More specifically, between the first node Q51 and the second node Q52, the third NMOS transistor M3 and the second NMOS transistor M2 are connected with a phase difference of π in radian through the first capacitor C1. Further, the fourth NMOS transistor M4 and the first NMOS transistor M1 are also connected with a phase difference of π through the second capacitor C2. Accordingly, when the third NMOS transistor M3 and the second NMOS transistor M2 are turned on during a half period of the oscillation waveform, the fourth NMOS transistor M4 and the first NMOS transistor M1 are turned off. On the contrary, when the third NMOS transistor M3 and the second NMOS transistor M2 are turned off during a half period of the oscillation waveform, the fourth NMOS transistor M4 and the first NMOS transistor M1 are turned on.

That is, smooth oscillation of the LC resonance circuit 120 can be achieved through the differential operation of the bias circuit 160, even though an external condition is changed by a process change, a temperature change and so on. Further, the magnitude of the oscillation waveform can be stabilized while maintaining a constant value.

Figure 6:
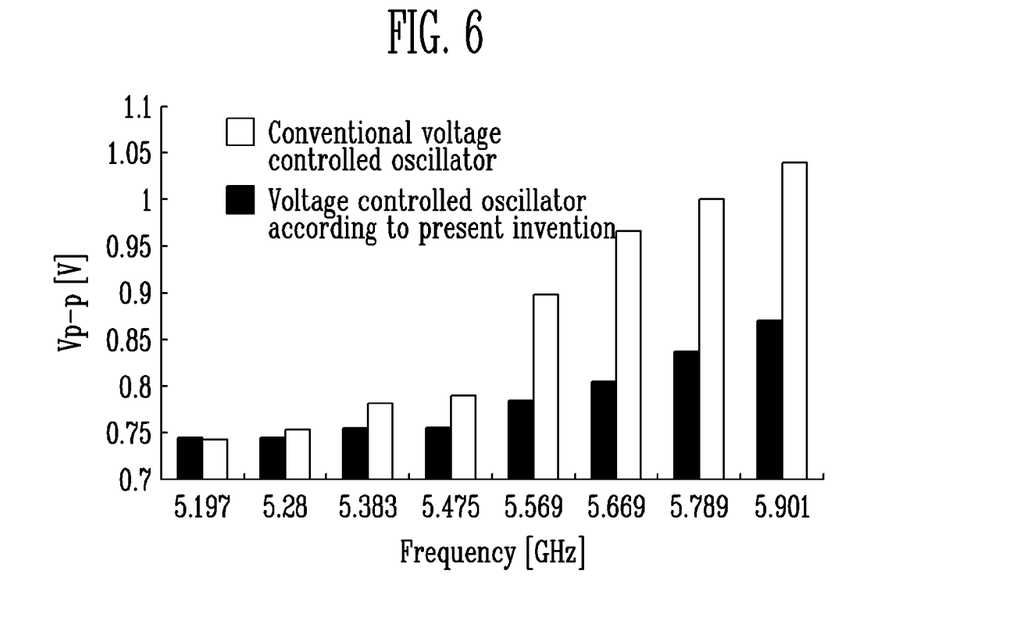
FIGS. 6 to 8 are graphs showing the results obtained by simulating magnitude characteristics of an oscillation waveform on frequency tuning, a process change, and a temperature change, respectively, with respect to the voltage controlled oscillator according to the present invention and the conventional voltage controlled oscillator.
Figure 7:
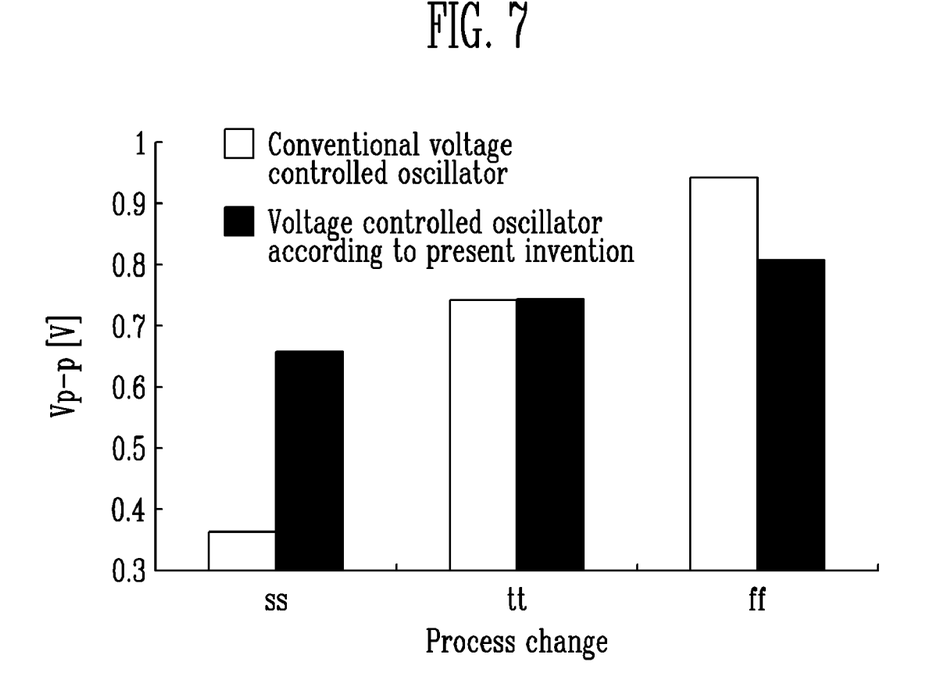
Figure 8:
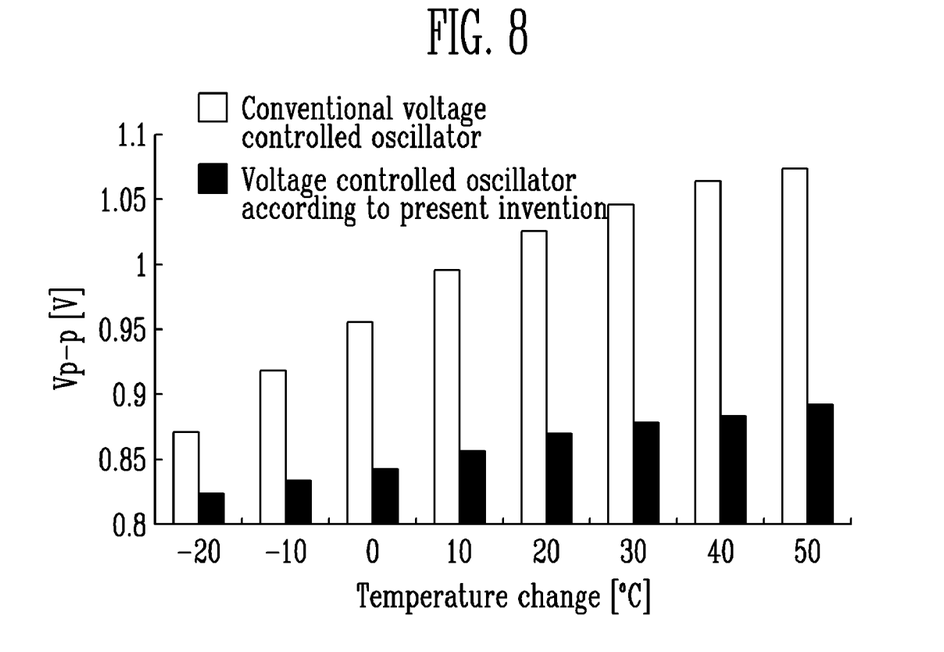

FIGS. 6 to 8 are graphs showing the results obtained by simulating magnitude characteristics of an oscillation waveform on frequency tuning, a process variation, and a temperature change, respectively, with respect to the voltage controlled oscillator according to the present invention and the conventional voltage controlled oscillator.

To obtain results under the same condition, the voltage controlled oscillator according to the present invention and the conventional voltage controlled oscillator are designed to have the same oscillation frequency and power consumption.

As shown in FIG. 6, it can be seen that, during the frequency tuning, a change in magnitude of the oscillation waveform with respect to a frequency change in the voltage controlled oscillator according to the present invention is 2.5 times smaller than in the conventional voltage controlled oscillator.

Further, as shown in FIG. 7, it can be seen that a change in magnitude of the oscillation waveform with respect to a process variation in the voltage controlled oscillator according to the present invention is three times smaller than in the conventional voltage controlled oscillator. Furthermore, as shown in FIG. 8, it can be seen that a change in the magnitude of the oscillation waveform with respect to a temperature change in the voltage controlled oscillator according to the present invention is three times smaller than in the conventional voltage controlled oscillator.

Figure 9:
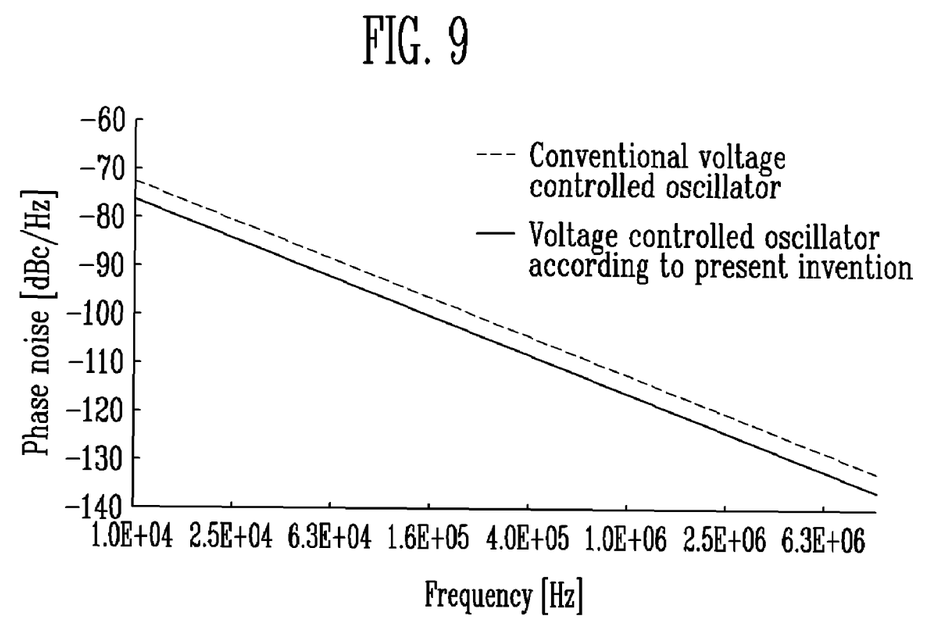
FIG. 9 is a diagram comparatively showing phase noise characteristics of the voltage controlled oscillator according to the present invention and the conventional voltage controlled oscillator.

FIG. 9 is a diagram comparatively showing phase noise characteristics of the voltage controlled oscillator according to the present invention and the conventional voltage controlled oscillator. In the voltage controlled oscillator according to the present invention to which the switching bias technique is applied, the flicker noise of the bias circuit is lowered, so that the phase noise characteristics of the voltage controlled oscillator according to the present invention are enhanced by 3.5 dBc in comparison with the conventional voltage controlled oscillator.

According to the present invention as described above, as a switching bias technique is applied to a voltage controlled oscillator, the flicker noise of a bias circuit is lowered. Therefore, while the phase noise characteristics are enhanced, the overall chip area is reduced, which makes it possible to achieve integration.

Further, a common mode voltage applied to the bias circuit is negatively fed back to the oscillation waveform. Therefore, it is possible to stabilize the magnitude of the oscillation waveform of the voltage controlled oscillator with respect to a change in an external condition.

While the invention has been shown and described with reference to certain exemplary embodiments thereof, it will be understood by those skilled in the art that various changes in form and detail may be made therein without departing from the spirit and scope of the invention as defined by the appended claims.

What is claimed is:

1. A voltage controlled oscillator with a switching bias, comprising:
    an LC resonance circuit which oscillates at a resonance frequency depending on an input voltage;
    a loss compensation circuit composed of first and second transistors which amplify the oscillated resonance frequency;
    a bias circuit composed of third and fourth transistors for providing a bias current to the first and second transistors; and
    a peak detector which detects a peak value from an oscillation waveform of the LC resonance circuit and then applies the detected peak value to the third and fourth transistors of the bias circuit, the peak detector being composed of fifth and sixth transistors and third and fourth capacitors.

2. A voltage controlled oscillator with a switching bias, comprising:
    an LC resonance circuit which oscillates at a resonance frequency depending on an input voltage;
    a loss compensation circuit composed of first and second transistors which amplify the oscillated resonance frequency;
    a bias circuit composed of third and fourth transistors for providing a bias current to the first and second transistors; and
    a switching circuit which periodically turns on/off the third and fourth transistors of the bias circuit depending on the oscillation waveform of the LC resonance circuit.

3. A voltage controlled oscillator with a switching bias, comprising:

an LC resonance circuit which oscillates at a resonance frequency depending on an input voltage;

a loss compensation circuit composed of first and second transistors which amplify the oscillated resonance frequency;

a bias circuit composed of third and fourth transistors for providing a bias current to the first and second transistors;

a peak detector which detects a peak value from an oscillation waveform of the LC resonance circuit and then applies the detected peak value to the third and fourth transistors of the bias circuit, the peak detector being composed of fifth and sixth transistors and third and fourth capacitors; and a switching circuit which periodically turns on/off the third and fourth transistors of the bias circuit depending on the oscillation waveform of the LC resonance circuit.

4. The voltage controlled oscillator according to claim 3, wherein the first and second transistors of the loss compensation circuit are differentially cross-coupled between first and second nodes, which are respectively connected to one end and the other end of the LC resonance circuit, and a third node serving as a common node of the first and second transistors, and wherein drain and gate terminals of the first transistor are connected to the first and second nodes, respectively, drain and gate terminals of the second transistor are connected to the second node and the first node, respectively, and source terminals of the first and second transistors are commonly connected to the third node.

5. The voltage controlled oscillator according to claim 1, wherein drain, gate, and source terminals of the third and fourth transistors of the bias circuit are commonly connected to the third node serving as a common node of the first and second transistors of the loss compensation circuit, a sixth node serving as a common node of the fifth and sixth transistors of the peak detector, and a ground terminal, respectively.

6. The voltage controlled oscillator according to claim 3, wherein drain terminals of the third and fourth transistors of the bias circuit are commonly connected to the third node serving as a common node of the first and second transistors of the loss compensation circuit, gate terminals of the third and fourth transistors are respectively connected to first and second nodes which are respectively connected to one end and the other end of the LC resonance circuit, and source terminals of the third and fourth transistors are commonly connected to a ground terminal.

7. The voltage controlled oscillator according to claim 3, wherein the fifth and sixth transistors of the peak detector are differentially cross-coupled between first and second nodes, which are respectively connected to one end and the other end of the LC resonance circuit, and a sixth node serving as a common node of the fifth and sixth transistors wherein drain and gate terminals of the fifth transistor are respectively connected to the first and second nodes, drain and gate terminals of the sixth transistor are respectively connected to the second node and the first node, and source terminals of the fifth and sixth transistors are commonly connected to the sixth node, and wherein the third and fourth capacitors are respectively connected between the sixth node and the ground terminal.

8. The voltage controlled oscillator according to claim 3, wherein when the third and fourth transistors of the bias circuit are composed of NMOS transistors, the fifth and sixth transistors of the peak detector are composed of NMOS transistors, and when the magnitude of the oscillation waveform of the LC resonance circuit increases, a negative peak value of the oscillation waveform detected from the peak detector decreases and a common mode voltage applied to gate terminals of the third and fourth transistors of the bias circuit decreases, so that the magnitude of the oscillation waveform of the LO resonance circuit decreases.

9. The voltage controlled oscillator according to claim 3, wherein when the third and fourth transistors of the bias circuit are composed of PMOS transistors, the fifth and sixth transistors of the peak detector are composed of PMOS transistors, and when the magnitude of the oscillation waveform of the LC resonance circuit increases, a positive peak value of the oscillation waveform detected from the peak detector decreases and a common mode voltage applied to gate terminals of the third and fourth transistors of the bias circuit decreases, so that the magnitude of the oscillation waveform of the LC resonance circuit decreases.

10. The voltage controlled oscillator according to claim 3, wherein a first capacitor is connected between a first node connected to one end of the LC resonance circuit and a gate terminal of the third transistor of the bias circuit, a second capacitor is connected between a second node connected to the other end of the LC resonance circuit and a gate terminal of the fourth transistor of the bias circuit, and first and second resistors are connected between the gate terminals of the third and fourth transistors.

11. The voltage controlled oscillator according to claim 10, wherein the oscillation waveform of the LC resonance circuit is applied to the gate terminals of the third and fourth transistors of the bias circuit through the first and second capacitors, respectively, and the peak value of the oscillation waveform detected from the peak detector is applied to the gate terminals of the third and fourth transistors of the bias circuit through the first and second resistors.

12. The voltage controlled oscillator according to claim 3, wherein in accordance with a switching operation of the switching circuit, when the third transistor of the bias circuit is turned on during a half period of the oscillation waveform, the fourth transistor of the bias circuit is turned off, and when the third transistor of the bias circuit is turned off during a half period of the oscillation waveform, the fourth transistor of the bias circuit is turned on.

13. The voltage controlled oscillator according to claim 3, wherein drain terminals of the third and fourth transistors of the bias circuit are connected to source terminals of the second and first transistors of the loss compensation circuit, respectively, so as to differentially operate.

14. The voltage controlled oscillator according to claim 13, wherein when the third transistor of the bias circuit and the second transistor of the loss compensation circuit are turned on during a half period of the oscillation waveform, the fourth transistor of the bias circuit and the first transistor of the loss compensation circuit are turned off, and when the third transistor of the bias circuit and the second transistor of the loss compensation circuit are turned off during a half period of the oscillation waveform, the fourth transistor of the bias circuit and the first transistor of the loss compensation circuit are turned on.

* * * * *